United States Patent [19]

Illman

[11] Patent Number: 4,780,628
[45] Date of Patent: Oct. 25, 1988

[54] TESTING PROGRAMMABLE LOGIC ARRAYS

[75] Inventor: Richard J. Illman, Stockport, Great Britain

[73] Assignee: International Computers Limited, London, England

[21] Appl. No.: 102,716

[22] Filed: Sep. 30, 1987

[30] Foreign Application Priority Data

Nov. 6, 1986 [GB] United Kingdom ............... 8626516

[51] Int. Cl.$^4$ ............... H03K 19/003; H03K 23/54
[52] U.S. Cl. .................................. 307/465; 307/468; 324/73 R; 371/15; 371/25; 377/72; 377/129
[58] Field of Search ............... 307/443, 465, 468–469; 377/19, 26, 54, 72, 81, 129; 364/716; 324/73 R, 73 AT; 371/15, 16, 25, 27

[56] References Cited

U.S. PATENT DOCUMENTS

| | | | |
|---|---|---|---|
| 4,103,182 | 7/1978 | Bradley | 307/465 |
| 4,366,393 | 12/1982 | Kasuya | 307/465 X |
| 4,525,714 | 6/1985 | Still et al. | 307/465 X |
| 4,536,881 | 8/1985 | Kasuya | 377/72 X |
| 4,546,473 | 10/1985 | Eichelberger et al. | 371/15 X |
| 4,598,401 | 7/1986 | Whelan | 371/25 |
| 4,635,261 | 1/1987 | Anderson et al. | 371/25 |
| 4,644,192 | 2/1987 | Fisher | 307/465 |
| 4,672,610 | 6/1987 | Salick | 371/25 X |
| 4,713,605 | 12/1987 | Iyer et al. | 371/25 X |

FOREIGN PATENT DOCUMENTS

| | | | |
|---|---|---|---|
| 0260867 | 12/1985 | Japan | 371/25 |
| 2121997 | 1/1984 | United Kingdom | 371/15 |
| 2172726 | 9/1986 | United Kingdom | 307/465 |

OTHER PUBLICATIONS

"Implementation of Diagnostics and Redundancy on a Programmable Logic Array", IBM T.D.B., vol. 28, No. 6, Nov. 1985, pp. 2371-3 (371/25).

Bhavsar et al., "Self-Testing by Polynomial Division", Digest of Papers-1981 International Test Conference, IEEE, pp. 208-16 (371/25).

Primary Examiner—Stanley D. Miller
Assistant Examiner—D. R. Hudspeth
Attorney, Agent, or Firm—Lee & Smith

[57] ABSTRACT

A programmable logic array (PLA) is described, having an integral decoder for selecting individual product lines. The integral decoder receives an input address by way of a set of buffers, which can be disabled so as to disable the integral decoder in normal operation. The buffers can be tested in their disabled state by means of an extra product line and extra output line. The extra product line is coupled to all the bit lines and to the extra output line, but not to any of the other output lines; the extra output line is coupled to the extra product line, but not to any of the other product lines. The buffers are tested by applying a sequence of addresses to the buffers in their disabled state, and observing the extra output line.

4 Claims, 2 Drawing Sheets

Fig.5.

```
DECODER
INPUT
PATTERN
| 1 1 1        |
|   1 1        |
|     1        |
| 1            |
|   1          |
| 1   1        |
| 1 1          |
| 1 1 1        |
|   1 1        |
|     1        |
| 1            |
|   1          |
| 1   1        |
| 1 1          |
| 1 1 1        |
|   1 1        |
|     1        |
| 1            |
|   1          |
| 1   1        |
| 1 1          |
| 1 1 1        |
|   1 1        |
|     1        |
| 1            |
|   1          |
| 1   1        |
| 1 1          |
```

```
DATA
INPUT
PATTERN
| 1              |
|   1            |
|     1          |
|       1        |
|         1      |
| 1              |
|   1            |
|     1          |
|       1        |
|         1      |
| 1              |
|   1            |
|     1          |
|       1        |
|         1      |
| 1              |
|   1            |
|     1          |
|       1        |
|         1      |
| 1              |
|   1            |
|     1          |
|       1        |
|         1      |
| 1              |
|   1            |
|     1          |
|       1        |
|         1      |
```

൪,൭൮൦,൬൨൮

TESTING PROGRAMMABLE LOGIC ARRAYS

This invention relates to testing programmable logic arrays and in particular is concerned with providing a programmable logic array which is specially adapted to facilitate testing.

A programmable logic array (PLA) is a well-known device for performing combinational logical functions. As described for example in IEEE Transactions in Computers, 1979, page 609, a PLA basically comprises a set of bit lines (usually in pairs, carrying complementary signals), a set of product lines which intersect the bit lines to form a first matrix of crosspoints (usually referred to as the AND plane or matrix) and a set of output lines which intersect the product lines to form a second matrix of crosspoints (usually referred to as the OR plane or matrix). At each crosspoint, the product line is selectively connected to the bit line or output line, or left unconnected, according to the desired logical function. The PLA can thus be programmed to perform a wide range of logical functions, consisting for example of combinations of AND and OR operations.

British Patent Specification No. 2 172 726 describes a PLA having an extension to the AND plane which acts as an integral decoder, allowing individual product lines to be selected one at a time in a test mode of operation. The integral decoder receives a sequence of addresses, by way of a set of buffers. These buffers can be disabled, so as to prevent the addresses from being applied to the integral decoder, thereby disabling the decoder as required for normal operation.

A problem with this arrangement is that, if a fault occurs in one of the buffers preventing it from being correctly disabled, this fault may be difficult to detect with conventional tests on the PLA. The object of the invention is to provide a PLA in which testing of these buffers is facilitated.

SUMMARY OF THE INVENTION

According to the invention there is provided a programmable logic array comprising a plurality of data bit lines selectively coupled to a plurality of product lines which are in turn selectively coupled to a plurality of output lines, a plurality of address bit lines selectively coupled to the product lines to form an integral decoder allowing individual product lines to be selected, sequencing means for applying a sequence of addresses to the address bit lines to select each product line in turn, and buffer means operable to disable all the address bit lines so as to prevent them having any effect on the product lines, characterised by a further product line and a further output line, the further product line being connected to all the address bit lines and to the further output line, but not to any of the other output lines, and the further output line being connected to the further product line but not to any of the other product lines, whereby faults in the buffer means preventing them from disabling the address bit lines can be detected by observation of output signals on the further output line.

BRIEF DESCRIPTION OF THE DRAWINGS

One PLA in accordance with the invention will now be described by way of example with reference to the accompanying drawings;

FIG. 5 is a table showing the sequence of application of test patterns to the PLA.

DESCRIPTION OF AN EMBODIMENT OF THE INVENTION

Figure 1:
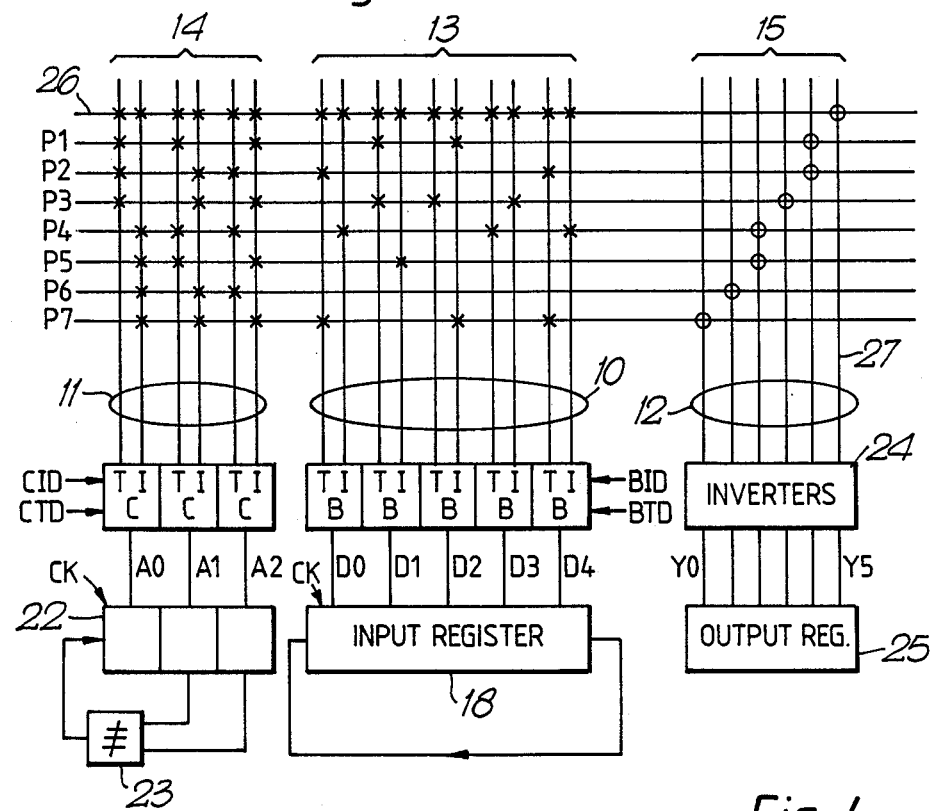
FIG. 1 is an overall diagram of the PLA.

Referring to FIG. 1, this shows a PLA comprising a set of product lines P1–P7, a set of data bit lines 10, a set of address bit lines 11, and a set of output lines 12. The data bit lines 10 intersect the product lines in a matrix 13 of crosspoints referred to as the AND plane. The address bit lines intersect the product lines in a matrix 14 which forms an extension of the AND plane and is referred to as the integral decoder. The output lines 12 intersect the product lines in a matrix 15 referred to as OR plane.

Figure 2:
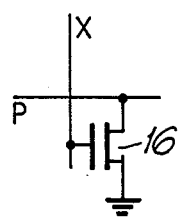
FIGS. 2 and 3 show crosspoints of the PLA in more detail.

The data bit lines 10 are connected to the product lines at selected crosspoints in the AND plane 13, as indicated by X in the drawing. The remaining crosspoints in the AND plane have no connections. Referring to FIG. 2, this shows one of the crosspoints X. At each crosspoint X, the data bit line 10 is connected to the gate electrode of an N type transistor 16. The source and drain electrodes of this transistor are respectively connected to the product line P and to ground potential (0 volts). Hence, if the bit line 10 is raised to a high voltage level (+5 volts), the product line P will be pulled down to ground potential.

Similarly, the address bit lines 11 are connected to the product lines at selected crosspoints X in the integral decoder 14, as shown. Each of these crosspoints X is also as shown in FIG. 2. Each prodcct line is connected to a different combination of address bit lines, in a standard binary decoder pattern. This allows any one of the product lines to be selected by applying a suitable address pattern to the address bit lines 11.

Figure 3:
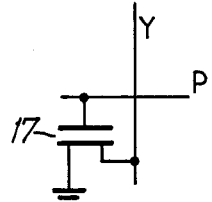

The data output lines 12 are connected to the product lines at selected crosspoints in the OR plane 15, as indicated by 0 in the drawing. The remaining crosspoints in the OR plane are unconnected. Referring to FIG. 3, this shows one of the crosspoints 0. At each crosspoint 0, the product line P is connected to the gate electrode of an N type transistor 17, the source and drain electrodes of which are respectively connected to the output line 12 and to ground potential (0 volts). Hence, if the product line P is at the high voltage level (+5 volts), the output line 12 is pulled down to 0 volts.

The data bit lines 10 receive input data bits D0–D4 from an input register 18, by way of a set of buffers B.

The input register 18 is operable in two different modes. In normal operation, it acts as a parallel input/output register, for receiving input data for the PLA. In a test mode of operation, the register 18 is operable as a circular shift register, with its serial output connected back to its serial input by a path 19. In this test mode, the register is controlled by a clock signal CK, so that at each beat of the clock signal the contents of the register are shifted one place to the right, the right-hand bit being fed back to the left-hand end. One such register is described in European Patent Specification No. 196 152 to which reference may be made for details.

Figure 4:
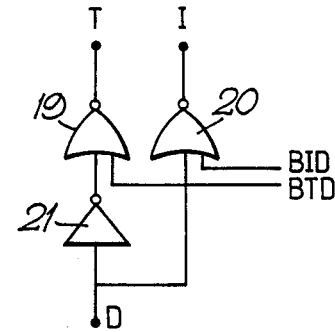
FIG. 4 shows a buffer circuit in more detail.

One of the buffers B is shown in detail in FIG. 4. The buffer comprises NOR gates 19,20. NOR gate 19 receives the data bit D from the input register 18 by way of an inverter 21, and produces a true output signal T.

NOR gate 20 receives the data bit D directly, and produces an inverse output signal I. The NOR gates 19,20 are respectively controlled by buffer disable signals BTD and BID.

In normal operation, both the disable signals BTD and BID are held low, so that all the buffers B are enabled, allowing each input data bit D to be applied to the true output T and its inverse to be applied to the inverse output I. In a test mode of operation, either BTD or BID can be set high. When BTD is high, the NOR gates 19 in all the buffers are disabled, forcing all the true outputs T low. When BID is high, the NOR gates 20 are disabled, forcing all the inverse outputs I low.

The address bit lines 11 receive an input address A0–A3 from a linear feedback shift register (LFSR) 22, by way of a set of buffers C.

The LFSR 22 comprises a three-stage shift register, with its second and third stages fed back to the serial input of the first stage by way of an exclusive-OR gate 23. The LFSR is controlled by the clock signal CK (which also controls the input register 18) so that, at each beat of the clock signal, the contents of the LFSR are shifted one place to the right, and the output of the exclusive-OR gate 23 is entered into the left-hand end of the LFSR. Thus, it can be seen that if, for example, the LFSR 22 is initially loaded with the bit pattern 111, then on successive beats of the clock signal CK the LFSR will generate the following sequence:

| A0 | A1 | A2 |
|----|----|----|
| 1  | 1  | 1  |
| 0  | 1  | 1  |
| 0  | 0  | 1  |
| 1  | 0  | 0  |
| 0  | 1  | 0  |
| 1  | 0  | 1  |
| 1  | 1  | 0  |

At the next shift, the LFSR will return to the pattern 111, and the above cycle will repeat. The LFSR thus produces a cyclic sequence of seven addresses. In general, an LFSR with M stages will produce a sequence of length $2^{M}-1$.

The buffers C are similar to the buffers B except that they are controlled by buffer disable signals CTD and CID instead of BTD and BID.

In normal operation, both CTD and CID are held high, and hence the buffers C are all disabled, forcing all the address bit lines 11 low. This disables the integral decoder 14, so that it has no effect on the product lines. In a test mode of operation, both CTD and CID are held low, and hence the buffers C are all enabled, allowing the address A0–A2 to be applied to the integral decoder, causing it to select one of the product lines.

The output lines 12 are connected to a set of inverters 24, which produce output data signals Y0–Y4. The output data is fed to an output register 25.

The output register 25 has two modes of operation. In normal operation it acts as a parallel input/output register for receiving output data from the PLA. In a test mode of operation, it can be operated as a parallel input digital signature analyser, to form a signature characteristic of a sequence of output data from the PLA. Such registers are well known in the art, one being descrioed for example in European Patent Specification No. 196 171 to which reference may be made for details.

OPERATION

For normal operation of the PLA, the input register 18 and the output register 25 are both set in their normal parallel input/output modes of operation. The buffers C are disabled (CID and CTD both high) so that all the address bit lines are held low. The buffers B are enabled (BID and BTD both low) so that data bits D0–D4 from the input register 18 are applied to the data bit lines 10.

The product lines P1–P7 are initially precharged to +5 volts by means of a conventional precharging circuit (not shown). It can be seen that any data bit line 10 which is high (+5 volts) will enable the transistors 16 in all the crosspoints X on that bit line, and thus causes the corresponding product lines to be pulled down to zero volts. Only those product lines not connected to any of the crosspoints X on any high bit line will remain at +5 volts. Hence, each product line forms the NOR function of the signals on the bit lines to which it is connected by the crosspoints X.

The output lines 12 are also pre-charged to +5 volts by means of a conventional pre-charging circuit (not shown). Any product lines remaining at +5 volts will enable the crosspoint transistors 17 to which they are connected, and this will pull the corresponding output lines 12 down to zero volts. Only those output lines not connected to any enabled transistors 17 will remain at +5 volts. Hence, each output line produces the NOR function of the product lines to which it is connected.

This normal mode of operation of the PLA is conventional, and so need not be described in any further detail.

The PLA can be operated so as to test individual crosspoints as follows.

The output register 25 is initialised to zero, and is set in its signature analyser mode.

The buffers C are enabled (CTD and CID both set low) so that the address bits A0–A2 from the LFSR 22 are applied to the address bit lines 11. As can be seen, this causes all the product lines, except for one, to be pulled down to zero volts. For example, if the address bits A0–A2 are equal to 001, then the product lines P2–P7 are all pulled down to zero volts, and only line P1 is allowed to remain at +5 volts, i.e. line P1 is selected.

It can be seen that, as the LFSR 22 steps through its sequence at successive beats of the clock CK, each of the product lines P1–P7 is selected in turn, although not in numerical order.

At the same time, the input register 18 is loaded with a test bit pattern 10000 (i.e. all zero except for one "1") and is set in its circular shift mode. Thus, at successive beats of the clock CK, the "1" in the input register is shifted along the register from left to right, and then fed back to the left-hand end, producing a sliding bit pattern. The true outputs T of the buffers B are enabled, by setting BTD low (BID remaining high). Hence, the sliding bit pattern from the register 18 is applied to the true bit lines 10, so as to select each of these lines in turn.

The combined effect of the operation of the LFSR 22 and the circular shifting of register 18 is to produce the sequence of input patterns to the PLA as shown in FIG. 5.

It can be seen that this sequence causes every combination of product line and true bit line to be selected, and therefore tests all the crosspoints in the AND plane connected to the true bit lines 10.

The input register 18 is then re-loaded with the inverse test pattern 01111 (i.e. all ones except for one zero) and the inverse outputs of the buffers B are enabled, by setting BID low, and BTD high. The above sequence is then repeated, so as to test the crosspoints connected to the inverse bit lines 10.

While these input sequences are being applied to the PLA, the output register 25 operates as a signature analyser, collecting a digital signature pattern characteristic of the sequence of outputs received from the output lines 12. At the end of the test sequences, this signature can then be compared with the signature that would be expected from a PLA with no faults; if they are not equal, this indicates that there is a fault in the PLA.

In order that this test procedure will give complete coverage of crosspoints in the AND plane, it is necessary that the lengths of the sequences produced by the LFSR 22 and the input register 18 should be coprime numbers. Two numbers are coprime if they have no common factor greater than 1. In the present example, the sequence length of the LFSR is 7 and that of the register is 5, and so these satisfy the required condition, since the highest common factor of 5 and 7 is 1.

In other embodiments of the invention, the PLA may have different numbers of product lines, bit lines and output lines, and the sequence lengths of the LFSR and circular shift register may be different from those described above, provided that the sequence lengths satisfy the above rule, that they are coprime.

In general, if the LFSR has M stages, then its sequence length is $2^{M}-1$, and if the circular shift register has N stages, its sequence length is N, so that the rule is that $2^{M}--1$ and N must be coprime. In order to satisfy this rule, it is possible to add spare, unused bits to the LFSR or circular shift register. For example, consider a PLA which requires a 4-stage LFSR (M=4) with a sequence length $2^4-1=15$, and which has 9 data input lines. If the input data register is 9 bits long (N=9) then the above rue would not be satisfied, since 15 and 9 are not coprime: they have a common factor 3. This can be avoided by making the input register 11 bits long (N=11) which satisfies the above rule since 15 and 11 are coprime. Two of the bits of the input register would therefore be spare, in the sense that they are not used for normal parallel input of data to the PLA. The only purpose of these two extra bits would be to increase the sequence length of the register, when in its circular shift mode, from 9 to 11 steps.

Figure 6:
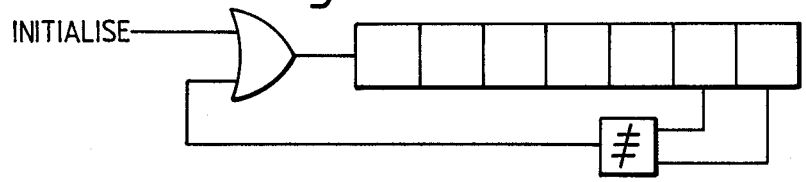
FIG. 6 shows an alternative linear feedback shift register for use in a PLA in accordance with the invention.

When designing a range of PLAs of different sizes, it is useful to have a standard size LFSR which can be used for a range of different PLAs. A seven bit LFSR, as shown in FIG. 6, is found to be particularly useful for this purpose. This gives a value of M=7, so that the sequence length is 127. This is a prime number, i.e. it has no factors. Therefore if N is less than 127 bits long, then $2^M-1$ and N will be coprime. Thus, the data input register can be any length, up to 126 bits.

In order to fully test the PLA, it is necessary to test the buffers B and C to ensure that each can be correctly enabled and disabled.

The operation of the buffers B and C in the enabled mode is tested when the crosspoints are tested as described above, and so no special test is required.

The operation of the buffers B in the disabled mode can be tested as follows. First, an all-one pattern is loaded into the input register 18, BTD and BID are both set high, and exhaustive patterns are generated in the LFSR22. This tests that the true bit lines have been correctly disabled. Then, an all-zero pattern is loaded into the input register, with BTD and BID again high, and exhaustive patterns are again generated in the LFSR22. This tests that the inverse bit lines have been correctly disabled.

In order to allow testing of the buffers C in the disabled mode, the PLA is provided with an extra product line 26, and an extra output line 27. The extra product line 26 is connected to every address bit line 11 and data bit line 10. The extra product line is also connected to the extra output line 27 in the OR plane 15, but is not connected to any of the other output lines 12. The extra output line 27 is not connected to any of the other product lines P1–P7.

In order to test the buffers C in the disabled mode, the control signals CTD, CID, BTD and BID are all held high, so as to disable all the address bit lines and data bit lines. The LFSR 22 is then clocked through its sequence. If all the buffers C are correctly disabled, the extra product line 26 will be high, and hence the extra output line 27 will be low. However, if there is a fault in one of the buffers C, preventing it from being disabled, the extra product line 26 will be pulled low at some point in the test cycle, causing the extra output line to go high. This will be detected by the output register 25 in its signature analysis mode.

I claim:

1. A programmable logic array comprising a plurality of data bit lines selectively coupled to a plurality of product lines which are in turn selectively coupled to a plurality of output lines, a plurality of address bit lines selectively coupled to the product lines to form an integral decoder allowing individual product lines to be selected, sequencing means for applying a sequence of addresses to the address bit lines to select each product line in turn, and buffer means operable to disable all the address bit lines so as to prevent them having any effect on the product lines, characterised by a further product line and a further output line, the further product line being connected to all the address bit lines and to the further output line, but not to any of the other output lines, and the further output line being connected to the further product line but not to any of the other product lines, whereby faults in the buffer means preventing them from disabling the address bit lines can be detected by observation of output signals on the further output line.

2. A programmable logic array according to claim 1 wherein the further product line is also connected to all the data bit lines.

3. A programmable logic array according to claim 1 wherein the sequencing means comprises a linear feedback shift register.

4. A programmable logic array according to claim 2 wherein the sequencing means comprises a linear feedback shift register.

* * * * *